United States Patent
Luley

(10) Patent No.: US 10,746,775 B1
(45) Date of Patent: Aug. 18, 2020

(54) TESTING SYSTEM AND METHOD WITH MULTIPLE ANTENNAS

(71) Applicant: Rohde & Schwarz GmbH & Co. KG, Munich (DE)

(72) Inventor: Martin Luley, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/279,529

(22) Filed: Feb. 19, 2019

(51) Int. Cl.
| | |
|---|---|
| *G01R 29/10* | (2006.01) |
| *H01Q 3/16* | (2006.01) |
| *H01Q 15/16* | (2006.01) |
| *G01R 29/08* | (2006.01) |

(52) U.S. Cl.
CPC ....... *G01R 29/105* (2013.01); *G01R 29/0878* (2013.01); *H01Q 3/16* (2013.01); *H01Q 15/16* (2013.01)

(58) Field of Classification Search
CPC .... G01R 29/105; G01R 29/0878; H01Q 3/16; H01Q 15/16
See application file for complete search history.

(56) References Cited

U.S. PATENT DOCUMENTS

| | | | |
|---|---|---|---|
| 8,190,097 B2 * | 5/2012 | Disbrow, Jr. ........ | H04B 17/373 343/869 |
| 8,537,446 B2 * | 9/2013 | Lal ..................... | G02B 26/0841 359/198.1 |
| 9,991,591 B1 * | 6/2018 | Rowell ................. | H01Q 3/267 |
| 2018/0006745 A1 | 1/2018 | Vanwiggeren | |
| 2018/0313877 A1 * | 11/2018 | Brant ...................... | H01Q 1/36 |

* cited by examiner

*Primary Examiner* — David Bilodeau
(74) *Attorney, Agent, or Firm* — Ditthavong & Steiner, P. C.

(57) ABSTRACT

A testing system and a testing method with multiple antennas are provided. The system comprises an anechoic chamber for containing a device under test, at least two feed antennas, a movable shaped reflector, and a reflector positioner rotationally coupled to the shaped reflector. The reflector positioner provides a rotation mechanism that rotates the shaped reflector and directs its focal point towards a field generated by each of the at least two feed antennas.

20 Claims, 5 Drawing Sheets

TESTING SYSTEM AND METHOD WITH MULTIPLE ANTENNAS

TECHNICAL FIELD

The present invention is in the field of measurements for testing the radiation performance of wireless devices. More particularly, the invention relates to a testing system and a testing method with multiple antennas within a compact antenna test range reflector chamber using a rotating reflector.

BACKGROUND OF THE INVENTION

The fast technological advances in wireless communications is leading to new applications and paradigms, such as Multiple-Input Multiple-Output (MIMO) systems and their use in the future 5G technology, which require novel techniques to test and measure their performance and proper functionality. In this context, in order to ensure accurate and efficient measurement tests, the frequency range of compact antenna test range (CATR) systems can be extended by employing multiple feed antennas.

US 2018/0006745 A1 provides a system for characterizing a device under test including an integrated antenna array. The system includes, within a chamber, an optical subsystem with first and second focal planes, where the antenna array is substantially located on the first focal plane of the optical subsystem. The system additionally includes a measurement array, having one or more array elements, positioned substantially on the second focal plane of the optical subsystem. Measurements of the device under test parameters at each array element in the measurement array is obtained by creating a far-field radiation pattern of the integrated antenna array at the measurement array.

Due to the fact that said system considers the antenna array and the optical subsystem at fixed positions within an anechoic chamber, switching between individual antennas that may operate at different frequencies is not envisaged.

Accordingly, there is the need for a system and a method enabling the characterization of a device under test in compact antenna test range arrangements with multiple feed antennas, whereby radiation received from each antenna can be independently considered by using a rotating shaped reflector.

SUMMARY OF THE INVENTION

Embodiments of the present disclosure, according to the first aspect of the invention, provide a testing system with multiple antennas comprising an anechoic chamber for containing a device under test, at least two feed antennas, a movable shaped reflector, and a reflector positioner rotationally coupled to the shaped reflector. The reflector positioner provides a rotation mechanism that rotates the shaped reflector and directs its focal point towards a field generated by each of the at least two feed antennas. Advantageously, fast switching between the antennas can be achieved with high accuracy, enabling realistic tests. Further advantageously, complexity can be reduced, facilitating calibration and reducing costs.

According to a first preferred implementation form of the first aspect of the invention, the device under test, the shaped reflector and the at least two feed antennas are placed inside the anechoic chamber. In addition to this or alternatively, each one of the at least two feed antennas substantially points at the shaped reflector. Advantageously, accuracy and efficiency can be enhanced in a compact system.

According to a second preferred implementation form of the first aspect of the invention, the rotation mechanism provided by the reflector positioner allows for rotational movement of the shaped reflector, whereby the shaped reflector rotates along an axis orthogonal to a plane wave front radiated by each of the at least two feed antennas. Advantageously, accuracy is further enhanced.

According to a further preferred implementation form of the first aspect of the invention, the shaped reflector corresponds to a parabolic compact antenna test range reflector. Moreover, the anechoic chamber is a shielded anechoic chamber. Additionally or alternatively the anechoic chamber is of cuboid shape. Advantageously, accuracy and efficiency can be increased.

According to a further preferred implementation form of the first aspect of the invention, the at least two feed antennas are arranged equidistantly from the shaped reflector inside the anechoic chamber. In this manner, efficiency and accuracy are further enhanced.

According to a further preferred implementation form of the first aspect of the invention, the feed antennas operate at different frequency ranges, especially a first antenna operates at a range covering 5 to 20 GHz, a second antenna operates at a range covering 18 to 50 GHz, a third antenna operates at a range covering 45 to 90 GHz. Advantageously, several frequency ranges can be supported simultaneously, increasing efficiency. Moreover, this allows for simulating several testing conditions.

According to a further preferred implementation form of the first aspect of the invention, the testing system further comprises a device under test positioner moving the device under test in at least two dimensions. Advantageously, this enables measurements in different positions.

According to a further preferred implementation form of the first aspect of the invention, the system further comprises, inside the anechoic chamber, a protective cylindrical wall enclosing the shaped reflector and operably attached to the reflector positioner and/or to the shaped reflector, whereby the reflector positioner synchronously rotates the shaped reflector and the protective cylindrical wall, with the focal point of the shaped reflector pointing at a lateral aperture of the protective cylindrical wall. Advantageously, interference between the at least two feed antennas is reduced. Further advantageously, accuracy and efficiency are both enhanced.

According to a further preferred implementation form of the first aspect of the invention, the protective cylindrical wall is a shielded wall with the outer side made with a metallic material and the inner side includes an absorbing material. Advantageously, interference is further reduced.

According to a further preferred implementation form of the first aspect of the invention, at least one of the feed antennas, preferably each of the at least two feed antennas, is arranged in a fixture that is removably arranged outside the anechoic chamber walls, and substantially points at the movable shaped reflector through a corresponding aperture in the anechoic chamber. Advantageously, interference between the at least two feed antennas is reduced, which also enhances accuracy and efficiency.

According to a further preferred implementation form of the first aspect of the invention, the fixture provides the corresponding feed antenna, manually or automatically, with a pivot movement. In addition to this, the feed antennas arranged outside and inside the anechoic chamber walls are located equidistantly from the shaped reflector. Advantageously, alignment between each one of the antennas and the shaped reflector is facilitated, increasing efficiency and accuracy.

According to the second aspect of the invention, a testing method with multiple antennas is provided. The method comprises providing an anechoic chamber for containing a device under test, and rotating a shaped reflector in the anechoic chamber and directing the focal point of the shaped reflector towards a field generated by each of at least two feed antennas. Advantageously, fast switching between the antennas can be achieved with high accuracy, enabling realistic tests. Further advantageously, complexity can be reduced, facilitating calibration and reducing costs.

According to a first preferred implementation form of the second aspect of the invention, the method further comprises placing inside the anechoic chamber the shaped reflector, a reflector positioner and at least two feed antennas substantially pointing at the shaped reflector. In addition to this, the method comprises rotating the shaped reflector along an axis orthogonal to a plane wave front radiated by each of the at least two feed antennas. Advantageously, accuracy and efficiency can be enhanced.

According to a second preferred implementation form of the second aspect of the invention, the shaped reflector corresponds to a parabolic compact antenna test range reflector. Moreover, the anechoic chamber is formed as a shielded anechoic chamber. Additionally or alternatively, the anechoic chamber is formed as cuboid shaped. Advantageously, accuracy and efficiency can be increased.

According to a further preferred implementation form of the second aspect of the invention, the method further comprises arranging the at least two feed antennas inside the anechoic chamber equidistantly from the shaped reflector. In this manner, efficiency and accuracy are further enhanced.

According to a further preferred implementation form of the second aspect of the invention, the feed antennas are operated at different frequency ranges, especially a first antenna is formed to operate at a range covering 5 to 20 GHz, a second antenna is formed to operate at a range covering 18 to 50 GHz, a third antenna is formed to operate at a range covering 45 to 90 GHz. Advantageously, several frequency ranges can be supported simultaneously, increasing efficiency. Moreover, this allows for simulating several testing conditions.

According to a further preferred implementation form of the second aspect of the invention, the testing method further comprises moving the device under test in at least two dimensions by using a device under test positioner. Advantageously, this enables measurements in different positions.

According to a further preferred implementation form of the second aspect of the invention, the testing method further comprises the steps of enclosing the shaped reflector with a protective cylindrical wall, attaching the protective cylindrical wall to the reflector positioner and/or to the shaped reflector, and rotating the shaped reflector and the protective cylindrical wall synchronously, with the focal point of the shaped reflector pointing at a lateral aperture of the protective cylindrical wall. Advantageously, interference between the at least two feed antennas is reduced. Further advantageously, accuracy and efficiency are both enhanced.

According to a further preferred implementation form of the second aspect of the invention, the protective cylindrical wall is formed as a shielded wall with the outer side made with a metallic material and the inner side includes an absorbing material. Advantageously, interference is further reduced.

According to a further preferred implementation form of the second aspect of the invention, the testing method further comprises the optional steps of arranging at least one of the feed antennas, preferably each of the at least two feed antennas, in a fixture that is removably arranged outside the anechoic chamber walls, and substantially pointing at the movable shaped reflector through a corresponding aperture in the anechoic chamber, wherein the fixture provides the corresponding feed antenna, manually or automatically, with a pivot movement; and arranging the feed antennas placed outside and inside the anechoic chamber walls are equidistantly located from the shaped reflector. Advantageously, interference between the at least two feed antennas is reduced, which also enhances accuracy and efficiency. Further advantageously, alignment between each one of the antennas and the shaped reflector is facilitated, increasing efficiency and accuracy.

BRIEF DESCRIPTION OF THE DRAWINGS

Illustrative embodiments of the present invention are now further explained by way of example only, and not for limitation, with respect to the accompanying drawings in which like reference numerals refer to similar elements. It is mentioned that the various features are not necessarily drawn to scale. In the drawings.

DETAILED DESCRIPTION OF THE INVENTION

Figure 1A:
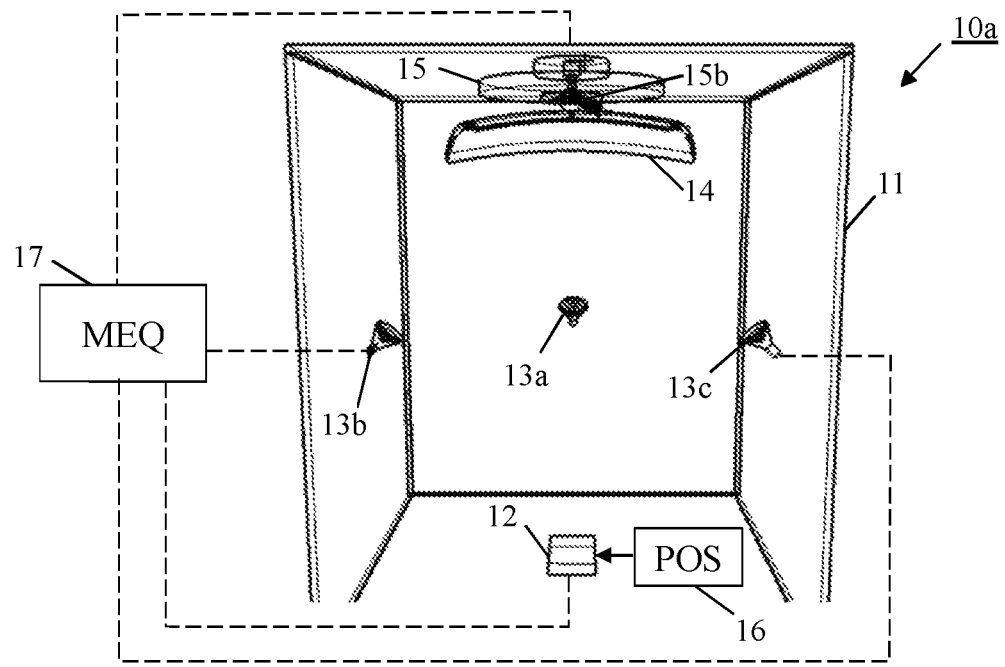
FIG. 1A shows a first exemplary embodiment of the first aspect of the invention.

An exemplary embodiment of an inventive testing system 10a is depicted in FIG. 1. The system 10a comprises an anechoic chamber 11 for containing a device under test 12, at least two feed antennas, exemplarily three feed antennas 13a, 13b, 13c, a movable shaped reflector 14, and a reflector positioner 15.

In this exemplary case, the device under test 12, the at least two feed antennas 13a, 13b, 13c, the shaped reflector 14 and the reflector positioner 15 are placed inside the anechoic chamber 11. In this context, it is mentioned that the shaped reflector 14 corresponds to a parabolic compact antenna test range reflector and the anechoic chamber 11 is a shielded anechoic chamber which additionally or alternatively is cuboid shaped.

As shown in FIG. 1, each of the at least two feed antennas 13a, 13b, 13c inside the anechoic chamber 11 is substantially pointing at the shaped reflector 14. It is mentioned that each of said feed antennas 13a, 13b, 13c radiates spherical waves towards the shaped reflector 14, which in turn reflects plane waves towards the device under test 12.

In addition to this, the reflector positioner 15 is rotationally coupled to the shaped reflector 14 and provides a rotation mechanism that rotates the shaped reflector 14 and directs the focal point of said shaped reflector 14 towards each one of the feed antennas 13a, 13b, 13c, especially a field generated by each of the antennas in a serial manner. In this context, it should be mentioned that while pointing at each feed antenna, exemplary antenna 13a, the shaped reflector 14 can also receive radiation from the other feed antennas 13b and 13c.

Moreover, the rotational movement of the shaped reflector 14 can be implemented in a horizontal manner with respect to its position inside the anechoic chamber 11; alternatively, it can be implemented in a vertical manner. Also, the reflector positioner 15 may be configured to additionally provide the shaped reflector 14 with a focus adjustment, exemplary the adjustment portion 15b.

Moreover, the rotation mechanism provided by the reflector positioner 15 can be achieved manually or automatically, and allows for rotational movement of the shaped reflector 14 whereby the shaped reflector 14 rotates along an axis orthogonal to a plane wave front radiated by each of the at least two feed antennas 13a, 13b, 13c. In this way, complexity is reduced since only the angular positioning accuracy is of relevance.

With respect to the at least two feed antennas 13a, 13b, 13c, it is mentioned that said feed antennas 13a, 13b, 13c in the embodiment are arranged equidistantly from the shaped reflector 14. In this context, a second feed antenna, exemplary antenna 13b, may be placed in the anechoic chamber 11 at the same level of a first antenna, exemplary antenna 13a, but offset a certain angle. Furthermore, it might be particularly advantageous that the feed antennas 13a, 13b, 13c operate at different frequency ranges, especially a first antenna, for example antenna 13a, operates at a range covering 5 to 20 GHz, a second antenna 13b operates at a range covering 18 to 50 GHz, and a third antenna 13c operates at a range covering 45 to 90 GHz.

As it can be noted in FIG. 1A, the inventive measurement system 10a further comprises a device under test positioner 16 and a measurement equipment 17. The device under test positioner 16 moves the device under test 12 in at least two dimensions allowing measurements in different positions. The measurement equipment 17 is configured to characterize the device under test 12 with respect to the radiation incident from the rotating shaped reflector 14 at different frequencies.

Figure 1B:
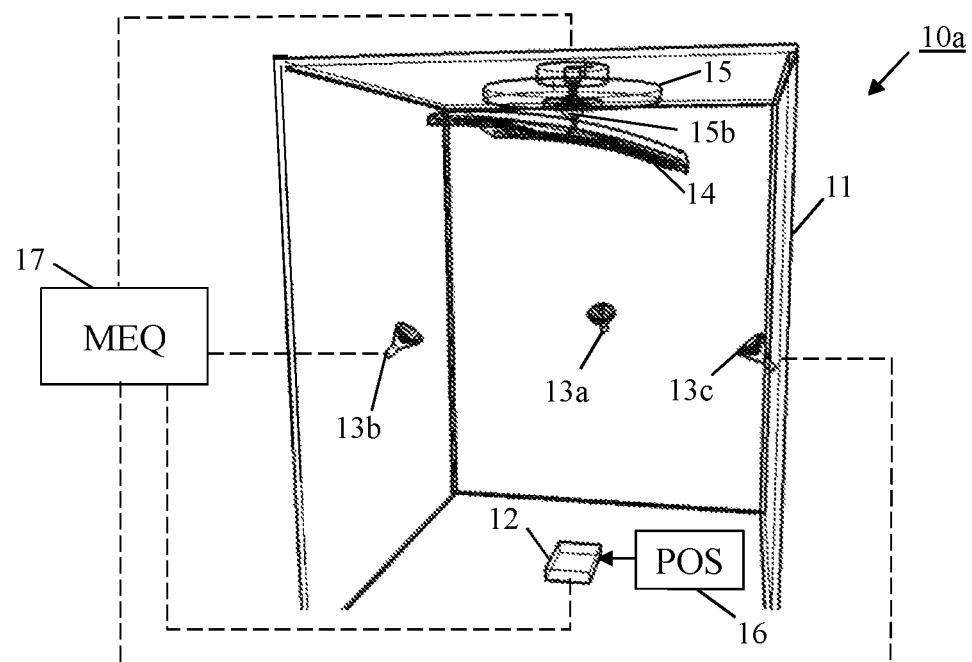
FIG. 1B shows a first exemplary cross-sectional view of a testing system, according to the first embodiment of the present invention.
Figure 1C:
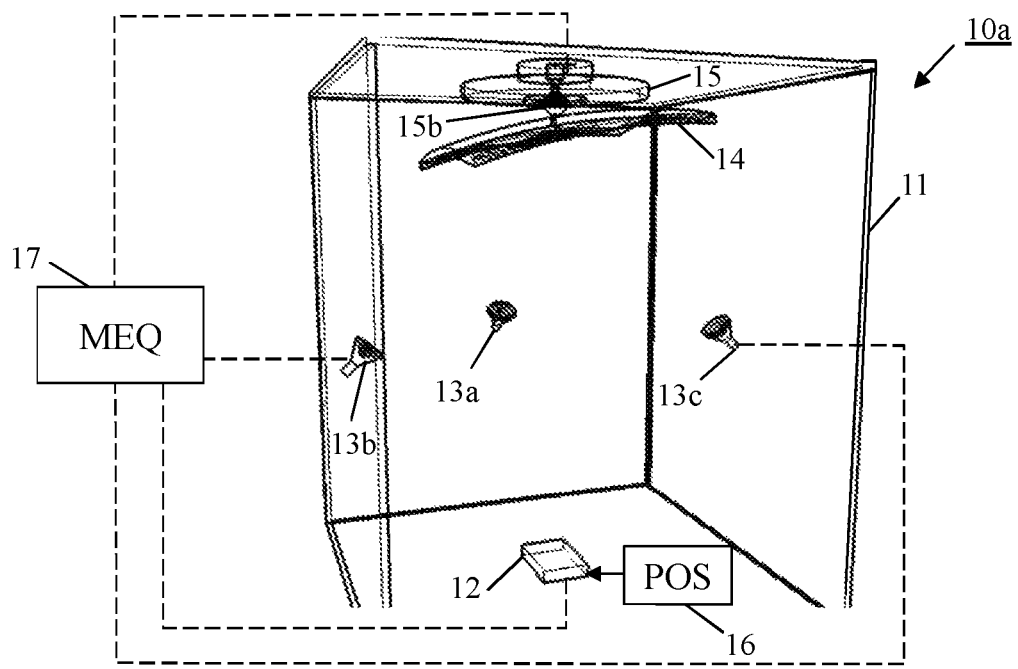
FIG. 1C shows a second exemplary cross-sectional view of a testing system, according to the first embodiment of the present invention.
Figure 1D:
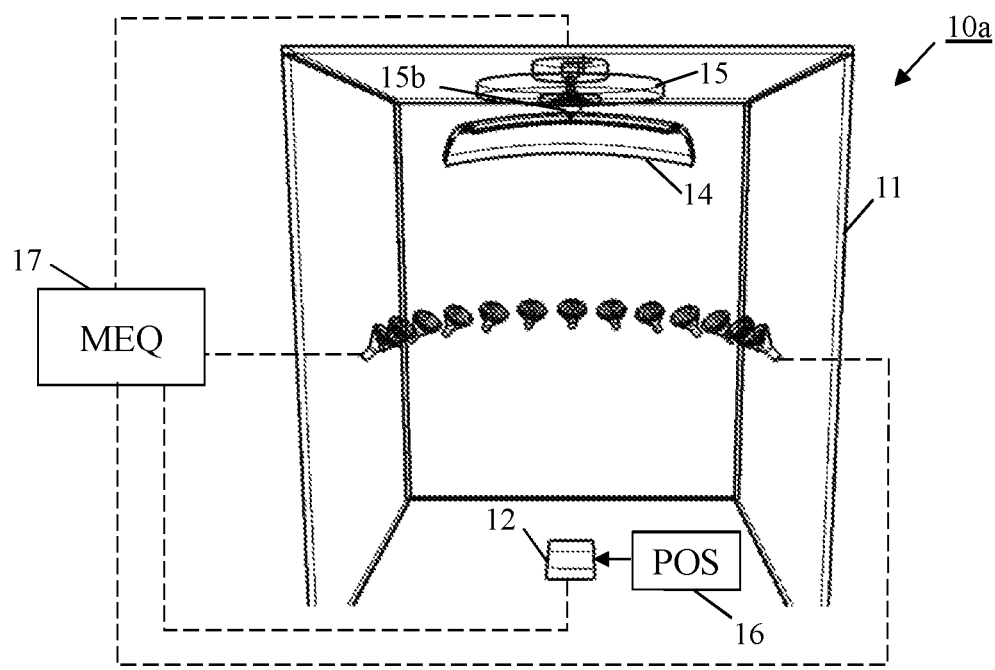
FIG. 1D shows an exemplary cross-sectional view of a testing system according to the first embodiment of the present invention.

In addition to the explanations above, the first embodiment of the invention should especially be discussed with respect to the exemplary cases depicted in FIG. 1B, FIG. 1C and FIG. 1D.

FIG. 1B shows an exemplary cross-section of the inventive testing system 10a, comprising three exemplary feed antennas 13a, 13b, 13c inside the anechoic chamber and pointing at the shaped reflector 14. In this particular example, each of the feed antennas 13a, 13b, 13 is placed at a side wall of the anechoic chamber 11 and the fourth side wall corresponds to the anechoic chamber door. From FIG. 1B it is noted that the shaped reflector 14 has been rotated by the reflector positioner 15, for example in a clockwise direction, until its focal point reached the radiation generated by the feed antenna 13b that operates at a particular frequency range.

Next, FIG. 1C shows another exemplary cross-section of the inventive system 10a, in which the shaped reflector 14 has been rotated in a counterclockwise direction until its focal point reached the radiation generated by the feed antenna 13c that operates at a particular frequency range, different from the frequency supported by the feed antenna 13b. The reflector positioner 15 may further rotate the shaped reflector 14 until its focal point reaches the radiation generated by the feed antenna 13a operating at a frequency range different from the frequency ranges supported by antennas 13b and 13c.

By way of further example, FIG. 1D shows a cross-section of the inventive system 10a in which several feed antennas are depicted. Each additional feed antenna is arranged, within the anechoic chamber 11, in the same plane formed by the feed antennas previously arranged in the chamber and equidistantly from the shaped reflector 14. In addition to this, the feed antennas operate at different frequency ranges. As explained before, the reflector positioner 15 rotates the shaped reflector 14 until its focal point reaches the radiation generated by each one of the several feed antennas.

Especially with respect to FIG. 1D, it is mentioned that the number of feed antennas that can be arranged in the anechoic chamber 11 is limited by the mechanical size of the shaped reflector 14. Moreover, it is noted that using a large number of feed antennas within the testing system 10a may also enhance interference and undesired reflections occurring at the shaped reflector 14.

Figure 2A:
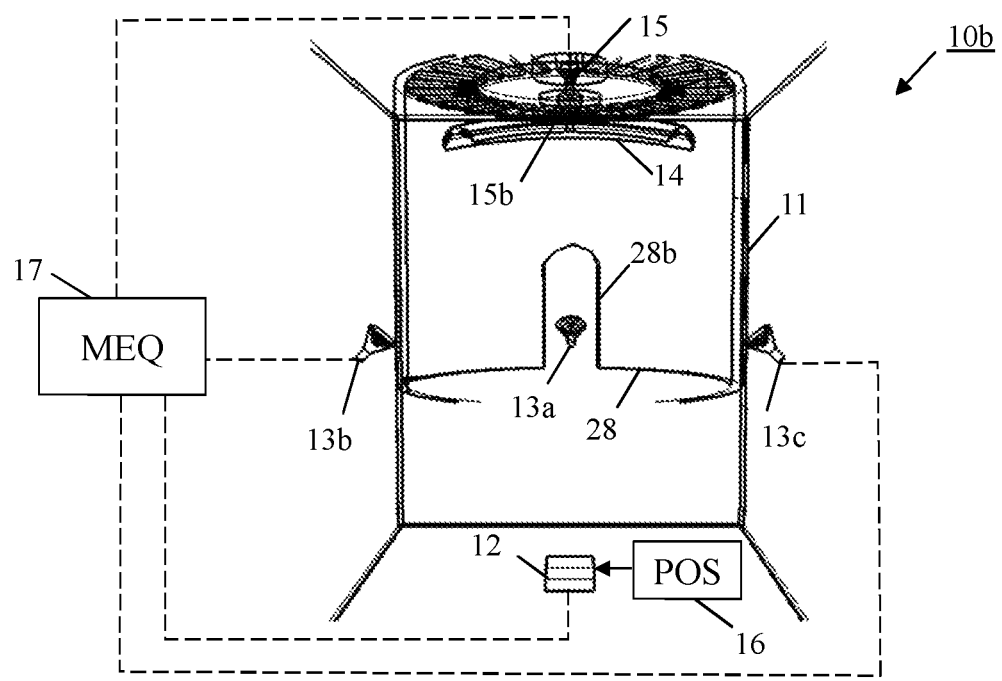
FIG. 2A a second exemplary embodiment of the first aspect of the invention.

In order to reduce the possible interference between the at least two feed antennas, a second exemplary embodiment of the inventive system 10b is illustrated in FIG. 2A. Said system 10b further comprises, inside the anechoic chamber 11, a protective cylindrical wall 28 enclosing the shaped reflector 14 and operably attached to the reflector positioner 15 and/or to the shaped reflector 14, whereby the reflector positioner 15 synchronously rotates the shaped reflector 14 and the protective cylindrical wall 28, with the focal point of the shaped reflector 14 pointing at a lateral aperture of the protective cylindrical wall 28, exemplary aperture 28b.

The lateral aperture 28b of the protective cylindrical wall 28 can be, for example, a slit parallel to the axis of the cylindrical wall 28. Moreover, in the context of FIG. 2A, the coupling of the protective cylindrical wall 28 to the reflector positioner 15 and/or to the shaped reflector 14 can be achieved, for example, by a fixture or the like equipment.

Furthermore, the protective cylindrical wall 28 is a shielded wall with the outer side made with a metallic material and the inner side includes an absorbing material.

As explained before, each of the at least two feed antennas, exemplary antennas 13a, 13b, 13c is placed in the anechoic chamber 11 pointing at the shaped reflector 14, and may be equidistantly located from the shaped reflector 14. In addition to this, the feed antennas 13a, 13b, 13c operate at different frequency ranges.

In the context of this embodiment, radiation generated by each one of the feed antennas 13a, 13b, 13c reaches the shaped reflector 14 only when the lateral aperture 28b of the protective cylindrical wall 28 and, therefore, the focal point of the shaped reflector 14 point towards said antenna during their joint rotation.

Figure 2B:
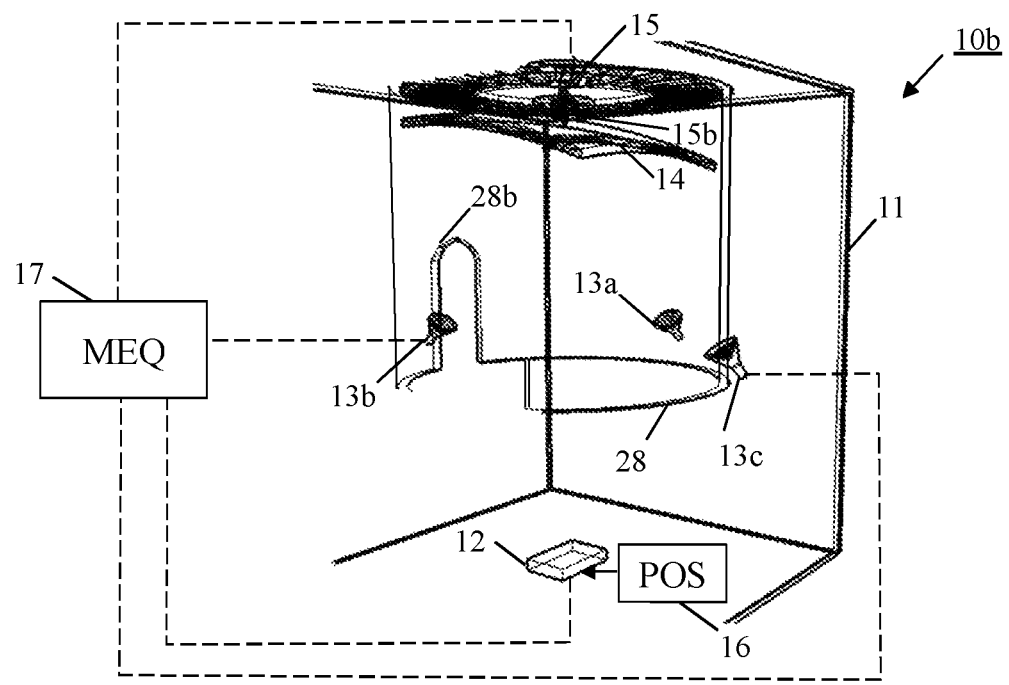
FIG. 2B shows a first cross-sectional view of a testing system according to the second embodiment of the present invention.

By way of example, FIG. 2B depicts a cross-section of the second embodiment of the inventive system 10b, in which the shaped reflector 14 and the protective cylindrical wall 28 have been synchronously rotated by the reflector positioner 15, for example in a clockwise direction, until the lateral aperture 28b and the reflector focal point reached the radiation generated by the feed antenna 13b, which operates at a particular frequency range.

Further clockwise synchronous rotation of the shaped reflector 14 and the protective cylindrical wall 28 prevents radiation to reach the shaped reflector 14 until its focal point is directed towards the next feed antenna 13a, through the lateral aperture 28b of the protective wall 28.

Figure 2C:
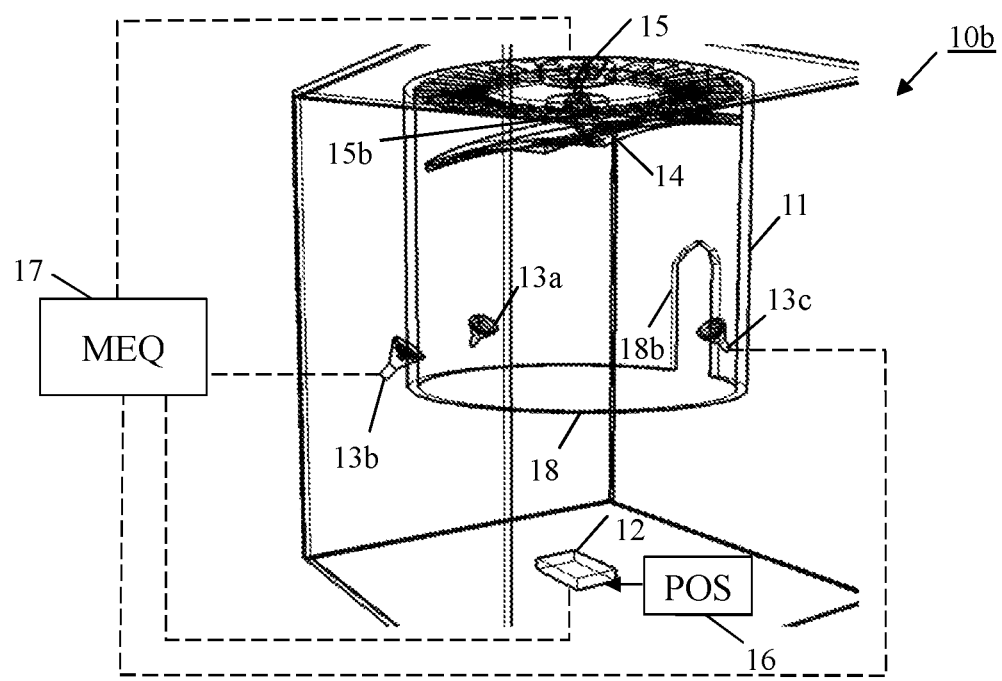
FIG. 2C shows a second cross-sectional view of a testing system according to the second embodiment of the present invention.

By way of further example, FIG. 2C shows a cross-section of the inventive system 10c, where the shaped reflector 14 and the protective cylindrical wall 28 have been rotated, by the reflector positioner 15, in a counter clockwise direction until the lateral aperture 28b of the cylindrical wall 28 and the focal point of the shaped reflector 14 reached the radiation generated by the feed antenna 13c, which operates at a different frequency range.

Figure 3:
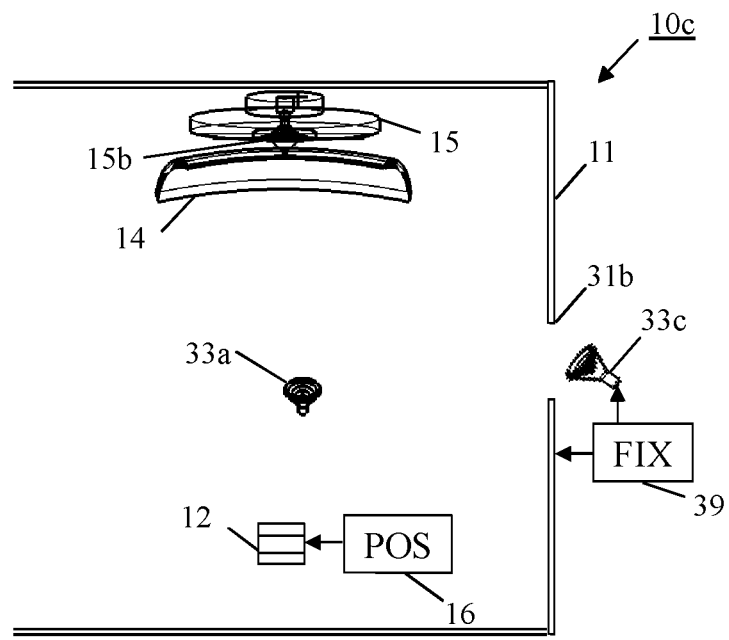
FIG. 3 shows a block diagram of a third exemplary embodiment of the first aspect of the invention.

A further exemplary embodiment of the inventive system 10c is now discussed. Said system, illustrated in FIG. 3, comprises a movable shaped reflector 14, a reflector positioner 15 rotationally coupled to the shaped reflector 14 and a device under test 12 placed inside the anechoic chamber 11.

The system 10c further comprises at least one of the at least two feed antennas, exemplary feed antenna 33c, arranged in a fixture 39 which is removably arranged outside the walls of the anechoic chamber 11. In this context, each of the at least one feed antenna 33c placed in the fixture 39 outside the anechoic chamber 11 substantially points at the movable shaped reflector 14 through a corresponding aperture in the anechoic chamber 11, exemplary aperture 31b.

Then, the reflector positioner 15 rotates the shaped reflector 14 and directs its focal point towards a field generated by each of the at least two feed antennas, 33b, 33c. From FIG. 3 it is noted that the walls of the anechoic chamber 11 in the vicinity of the aperture 31b suppress the radiation arriving at the shaped reflector 14 while it rotates away from the field generated by the at least one feed antenna 33c placed outside the anechoic chamber 11. Advantageously, interference caused by the at least two feed antennas is reduced.

With respect to this exemplary third embodiment, the at least two feed antennas located inside 33b and outside 33c the anechoic chamber 11, are arranged at the same distance and at the same angle from the movable shaped reflector 14 and may operate at different frequency ranges. Also, the fixture 39 provides the at least one feed antenna 33c, manually or automatically, with a pivot mechanism which enhances the alignment between said feed antenna 33c and the focal point of the movable shaped reflector 14. Additionally, the pivot mechanism provided by the fixture can deactivate the at least one feed antenna 33c, preferably each one of the feed antennas arranged in the fixture 39, by directing said feed antenna away from the shaped reflector 14.

It might be particularly advantageous if the inventive testing system 10c further comprises a protective cylindrical wall enclosing the movable shaped reflector 14, attached to the shaped reflector 14 and/or the reflector positioner 15, and rotated synchronously with the shaped reflector having the focal point of the shaped reflector pointing at a lateral aperture of the protective cylindrical wall, as explained before. In this manner, switching between the feed antennas with reduced interference is achieved, enhancing test efficiency and test accuracy.

As explained above, the inventive system 10c may further comprise a device under test positioner 16 and a measurement equipment 17 (not shown).

Figure 4:
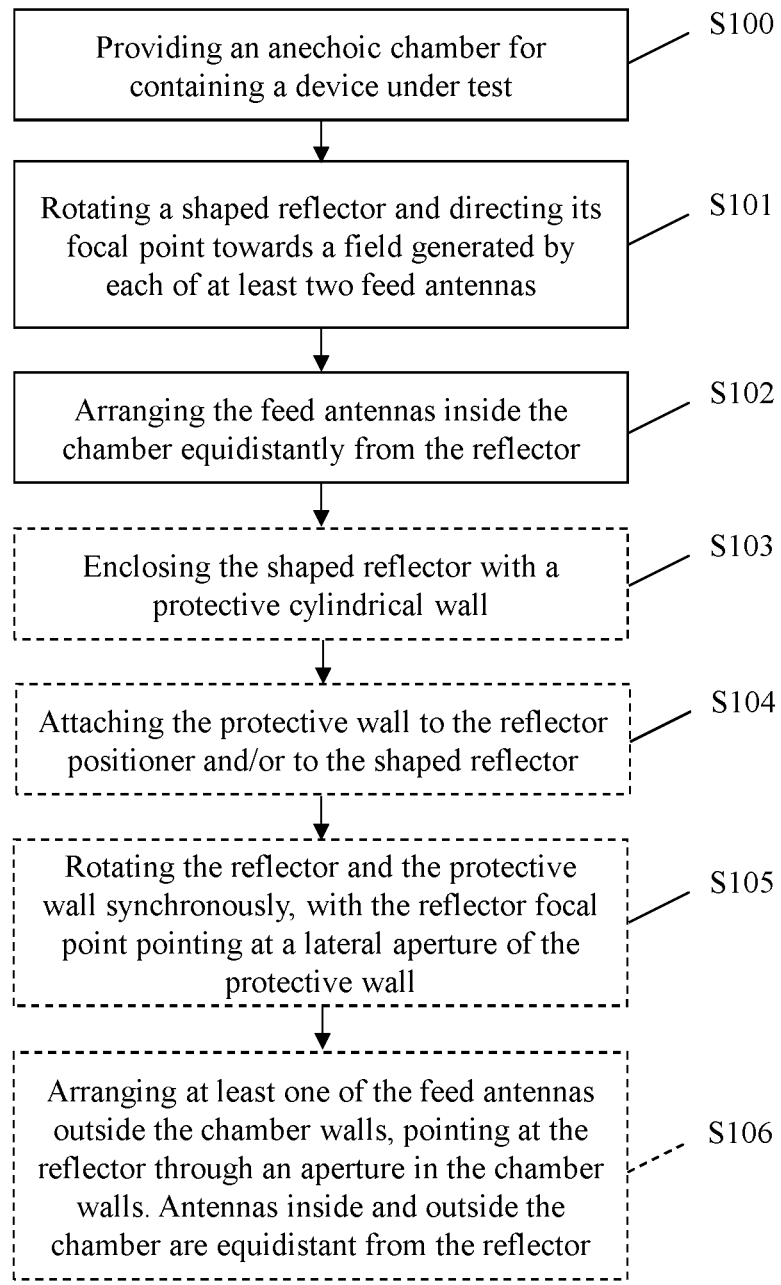
FIG. 4 shows a flow chart of a representative embodiment of the second aspect of the invention.

Now, a flow chart of an embodiment of the inventive testing method according to the second aspect of the invention is shown in FIG. 4. In a first step S100, an anechoic chamber for containing a device under test is provided. In a second step S101, a shaped reflector in the anechoic chamber is rotated and the focal point of the shaped reflector is directed towards a field generated by each of at least two feed antennas.

The inventive method further comprises that the shaped reflector, a reflector positioner and at least two feed antennas substantially pointing at the shaped reflector, are placed inside the anechoic chamber. In addition to this, the shaped reflector is rotated along an axis orthogonal to a plane wave front radiated by each of the at least two feed antennas.

In this context, the shaped reflector corresponds to a parabolic compact antenna test range reflector. Moreover, the anechoic chamber is formed as a shielded anechoic chamber which additionally or alternatively is formed as cuboid shaped.

Then, in a third step S102, the at least two feed antennas are arranged inside the anechoic chamber equidistantly from the shaped reflector. Furthermore, the testing method may comprise that the feed antennas are operated at different frequency ranges, especially a first antenna is formed to operate at a range covering 5 to 20 GHz, a second antenna is formed to operate at a range covering 18 to 50 GHz, a third antenna is formed to operate at a range covering 45 to 90 GHz.

Also, the testing method may further comprise moving the device under test in at least two dimensions by using a device under test positioner.

It might be particularly advantageous if the inventive method further comprises the optional steps of enclosing S103 the shaped reflector with a protective cylindrical wall, attaching S104 the protective cylindrical wall to the reflector positioner and/or to the shaped reflector, and rotating S105 the shaped reflector and the protective cylindrical wall synchronously, with the focal point of the shaped reflector pointing at a lateral aperture of the protective cylindrical wall.

In this context, the protective cylindrical wall is formed as a shielded wall with the outer side made with a metallic material and the inner side includes an absorbing material.

The testing method may comprise the further optional step S106 of arranging at least one of the feed antennas, preferably each of the at least two feed antennas, in a fixture that is removably arranged outside the anechoic chamber walls, and substantially pointing at the movable shaped reflector through a corresponding aperture in the anechoic chamber, wherein the fixture provides the corresponding feed antenna, manually or automatically, with a pivot movement. In addition to this, the feed antennas placed outside and inside the anechoic chamber walls are arranged equidistantly from the shaped reflector.

In order to further suppress interference caused by the at least two feed antennas arranged inside and outside the anechoic chamber, the method may additionally comprise enclosing the shaped reflector with a protective cylindrical wall, attaching said protective cylindrical wall to the reflector positioner and/or to the shaped reflector, and rotating synchronously the shaped reflector and the protective cylindrical wall, with the focal point of the shaped reflector pointing at a lateral aperture of the protective cylindrical wall.

While various embodiments of the present invention have been described above, it should be understood that they have been presented by way of example only, and not limitation. Numerous changes to the disclosed embodiments can be made in accordance with the disclosure herein without departing from the scope of the invention. Thus, the breadth and scope of the present invention should not be limited by any of the above described embodiments. Rather, the scope of the invention should be defined in accordance with the appended claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A testing system with multi antennas comprising:
   an anechoic chamber for containing a device under test,
   at least two feed antennas,
   a movable shaped reflector, and
   a reflector positioner rotationally coupled to the shaped reflector,
   wherein the reflector positioner provides a rotation mechanism that rotates the shaped reflector and directs a focal point of the shaped reflector towards each of the at least two feed antennas, and
   wherein the rotation mechanism provided by the reflector positioner allows for rotational movement of the shaped reflector, whereby the shaped reflector rotates along an axis orthogonal to a plane wave front radiated by each of the at least two feed antennas.

2. The system according to claim 1,
   wherein the device under test, the shaped reflector and the at least two feed antennas are placed inside the anechoic chamber, and/or
   wherein each one of the at least two feed antennas substantially points at the shaped reflector.

3. The system according to claim 1,
   wherein the shaped reflector corresponds to a parabolic compact antenna test range reflector, and/or
   wherein the anechoic chamber is a shielded anechoic chamber, and/or
   wherein the anechoic chamber is cuboid shaped.

4. The system according to claim 1,
   wherein the at least two feed antennas are arranged equidistantly from the shaped reflector inside the anechoic chamber.

5. The system according to claim 1,
   wherein the feed antennas operate at different frequency ranges, wherein a first antenna operates at a range covering 5 to 20 GHz, a second antenna operates at a range covering 18 to 50 GHz, a third antenna operates at a range covering 45 to 90 GHz.

6. The system according to claim 1,
   wherein the system further comprises a device under test positioner moving the device under test in at least two dimensions.

7. The system according to claim 1,
   wherein the system further comprises, inside the anechoic chamber, a protective cylindrical wall enclosing the shaped reflector and operably attached to the reflector positioner and/or to the shaped reflector, whereby the reflector positioner synchronously rotates the shaped reflector and the protective cylindrical wall, with the focal point of the shaped reflector pointing at a lateral aperture of the protective cylindrical wall.

8. The device according to claim 7,
   wherein the protective cylindrical wall is a shielded wall with the outer side made with a metallic material and the inner side includes an absorbing material.

9. The system according to claim 1,
   wherein at least one of the at least two feed antennas is arranged in a fixture that is removably arranged outside the anechoic chamber walls, and substantially points at the movable shaped reflector through a corresponding aperture in the anechoic chamber.

10. The system according to claim 9,
    wherein the fixture provides the corresponding feed antenna, manually or automatically, with a pivot movement, and
    wherein the feed antennas arranged outside and inside the anechoic chamber walls are located equidistantly from the shaped reflector.

11. A testing method with multiple antennas, comprising:
    providing an anechoic chamber for containing a device under test, and
    rotating a shaped reflector in the anechoic chamber and directing a focal point of the shaped reflector towards each of at least two feed antennas, whereby rotating the shaped reflector along an axis orthogonal to a plane wave front radiated by each of the at least two feed antennas.

12. The method according to claim 11,
    wherein the method further comprises placing inside the anechoic chamber the shaped reflector, a reflector positioner and at least two feed antennas substantially pointing at the shaped reflector.

13. The method according to claim 11,
    wherein the shaped reflector corresponds to a parabolic compact antenna test range reflector and/or
    wherein the anechoic chamber is formed as a shielded anechoic chamber and/or
    wherein the anechoic chamber is formed as cuboid shaped.

14. The method according to claim 11,
    wherein the method further comprises arranging the at least two feed antennas inside the anechoic chamber equidistantly from the shaped reflector.

15. The method according to claim 11,
    wherein the feed antennas are operated at different frequency ranges, wherein a first antenna is formed to operate at a range covering 5 to 20 GHz, a second antenna is formed to operate at a range covering 18 to 50 GHz, a third antenna is formed to operate at a range covering 45 to 90 GHz.

16. The method according to claim 11,
    wherein the method further comprises moving the device under test in at least two dimensions by using a device under test positioner.

17. The method according to claim 11,
    wherein the method further comprises the steps of:
    enclosing the shaped reflector with a protective cylindrical wall,
    attaching the protective cylindrical wall to the reflector positioner and/or to the shaped reflector, and
    rotating the shaped reflector and the protective cylindrical wall synchronously, with the focal point of the shaped reflector pointing at a lateral aperture of the protective cylindrical wall.

18. The method according to claim 17,
wherein the protective cylindrical wall is formed as a shielded wall with the outer side made with a metallic material and the inner side includes an absorbing material.

19. The method according to claim 11,
wherein the method further comprises the steps of:
arranging at least one of the at least two feed antennas in a fixture that is removably arranged outside the anechoic chamber walls, and substantially pointing at the movable shaped reflector through a corresponding aperture in the anechoic chamber, wherein the fixture provides the corresponding feed antenna, manually or automatically, with a pivot movement, and
arranging the feed antennas placed outside and inside the anechoic chamber walls are equidistantly located from the shaped reflector.

20. The system according to claim 1, wherein the rotational movement of the shaped reflector is implemented in a horizontal manner with respect to its position inside the anechoic chamber.

\* \* \* \* \*